US010305012B2

(12) United States Patent
Toyoda et al.

(10) Patent No.: US 10,305,012 B2
(45) Date of Patent: *May 28, 2019

(54) ELECTRICAL CONVERTER AND HEATER MODULE WITH HEAT INSULATORS HAVING DIFFERENT CROSS-SECTIONAL AREAS

(71) Applicant: Panasonic Intellectual Property Management Co., Ltd., Osaka (JP)

(72) Inventors: Kaori Toyoda, Chiba (JP); Satoshi Maeshima, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/707,046

(22) Filed: Sep. 18, 2017

(65) Prior Publication Data
US 2018/0013047 A1    Jan. 11, 2018

Related U.S. Application Data

(63) Continuation of application No. 14/499,396, filed on Sep. 29, 2014, now Pat. No. 9,793,460.

(30) Foreign Application Priority Data

May 22, 2014 (JP) ................. 2014-106151

(51) Int. Cl.
| | | |
|---|---|---|
| H01L 35/04 | (2006.01) | |
| H01L 35/18 | (2006.01) | |
| H01L 35/32 | (2006.01) | |
| H01L 35/08 | (2006.01) | |

(52) U.S. Cl.
CPC .............. H01L 35/04 (2013.01); H01L 35/08 (2013.01); H01L 35/18 (2013.01); H01L 35/32 (2013.01)

(58) Field of Classification Search
CPC ......... H01L 35/04; H01L 35/12; H01L 35/18; H01L 35/20; H01L 35/02; H01L 35/32; H01L 35/34
See application file for complete search history.

(56) References Cited

U.S. PATENT DOCUMENTS

| | | |
|---|---|---|
| 2007/0084497 A1 | 4/2007 | Strnad |
| 2013/0199593 A1 | 8/2013 | Higashida |
| 2013/0306124 A1 | 11/2013 | Yajima |

FOREIGN PATENT DOCUMENTS

| | | |
|---|---|---|
| WO | 2012/066788 A2 | 5/2012 |
| WO | 2015/099659 A1 | 7/2015 |

OTHER PUBLICATIONS

M.G. Kanatzidis et al., "Chemistry, Physics, and Materials Science of Thermoelectric Materials" 2003, Springer Science, First Ed. p. 134.

*Primary Examiner* — Angelo Trivisonno
(74) *Attorney, Agent, or Firm* — Pearne & Gordon LLP (57) ABSTRACT

An electrical converter and heater module with heat insulators having different cross-sectional areas includes a thermoelectric conversion module that corrects the difference in thermal resistance between a P-type thermoelectric conversion member and an N-type thermoelectric conversion member. In this thermoelectric conversion module, since insulators included in the P-type thermoelectric conversion member and the N-type thermoelectric conversion member have a different thermal resistance, it is possible to correct the difference in thermal resistance between the P-type thermoelectric conversion element and the N-type thermoelectric conversion element.

14 Claims, 7 Drawing Sheets

ELECTRICAL CONVERTER AND HEATER MODULE WITH HEAT INSULATORS HAVING DIFFERENT CROSS-SECTIONAL AREAS

CROSS REFERENCE TO RELATED APPLICATIONS

This application is entitled and claims the benefit of U.S. patent application Ser. No. 14/499,396 filed Sep. 29, 2014 and Japanese Patent Application No. 2014-106151, filed on May 22, 2014, the disclosure of which including the specification, drawings and abstract is incorporated herein by reference in its entirety.

TECHNICAL FIELD

The present invention relates to an electrical converter and heater module including a thermoelectric conversion module with heat insulators having different cross-sectional areas.

BACKGROUND ART

Figure 4:
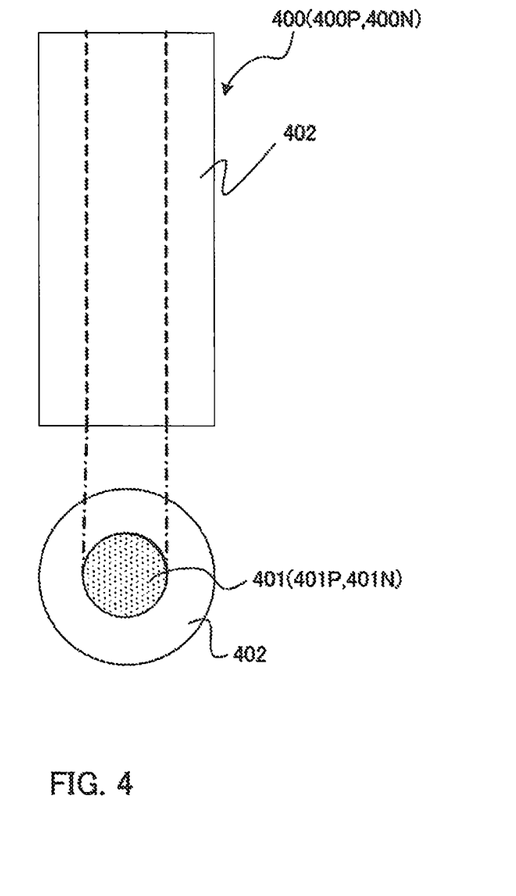
FIG. 4 is a diagram illustrating a thermoelectric conversion element in the related art described in PTL 1.

The thermoelectric conversion module is a combination of thermoelectric conversion elements including a P-type semiconductor and thermoelectric conversion elements including an N-type semiconductor and uses a temperature difference to generate an electromotive force. FIG. 4 illustrates a structural example of a thermoelectric conversion element. P-type or N-type thermoelectric conversion element 400 illustrated in FIG. 4 is formed of P-type or N-type thermoelectric conversion member 401 filling hollow tubular heat-resistant insulating member 402. P-type thermoelectric conversion element 400P includes P-type thermoelectric conversion member 401P, and N-type thermoelectric conversion element 400N includes N-type thermoelectric conversion member 401N.

Figure 5:
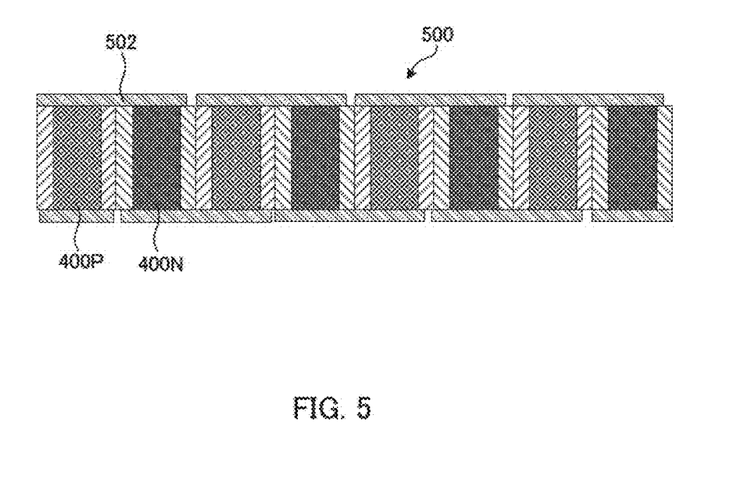
FIG. 5 is a diagram illustrating a thermoelectric conversion element in the related art described in PTL 1.

The thermoelectric conversion module is composed of a combination of P-type thermoelectric conversion element 400P and N-type thermoelectric conversion element 400N. Thermoelectric conversion module 500 illustrated in FIG. 5 has a configuration in which P-type thermoelectric conversion element 400P and N-type thermoelectric conversion element 400N are electrically connected in series with electrode 502 (for example, see PTL 1).

CITATION LIST

Patent Literature

PTL 1
International Publication No. WO 2012/066788

SUMMARY OF INVENTION

Technical Problem

The P-type thermoelectric conversion member and the N-type thermoelectric conversion member have different thermal characteristics. Therefore, in a thermoelectric conversion module in the related art, the thermal resistance of the P-type thermoelectric conversion element and the thermal resistance of the N-type thermoelectric conversion element are different from each other.

In a thermoelectric conversion element, holes are generated in the P-type thermoelectric conversion element and electrons are generated in the N-type thermoelectric conversion element by thermal energy to generate electric power. Accordingly, if the P-type thermoelectric conversion element and the N-type thermoelectric conversion element have different thermal resistance, the amount of flow of thermal energy varies between the P-type thermoelectric conversion element and the N-type thermoelectric conversion element, which means that the flow rate varies between holes and electrons. The amount of current is rate-limited to a smaller flow rate, which causes degradation in power generation performance for a thermoelectric conversion module.

The present invention has been made to solve the above-mentioned problems in the related art, and an object of the present invention is to provide a thermoelectric conversion element module in which the difference in thermal resistance is corrected (reduced) between the P-type thermoelectric conversion member and the N-type thermoelectric conversion member so as to exhibit high performance.

Solution to Problem

The present invention provides a thermoelectric conversion module including: a P-type thermoelectric conversion element that has a P-type thermoelectric conversion member and a first insulator to cover the P-type thermoelectric conversion member; an N-type thermoelectric conversion element that has an N-type thermoelectric conversion member and a second insulator to cover the N-type thermoelectric conversion member; and an electrode that electrically connects the P-type thermoelectric conversion member with the N-type thermoelectric conversion member.

In one aspect of the provided thermoelectric conversion module, the thermoelectric conversion module includes an electrode that electrically connects the P-type thermoelectric conversion member with the N-type thermoelectric conversion member, wherein, in a cross section orthogonal to a direction of current flowing in the P-type thermoelectric conversion member or the N-type thermoelectric conversion member, an area of the first insulator and an area of the second insulator are different and a difference in thermal resistance between the P-type thermoelectric conversion element and the N-type thermoelectric conversion element is smaller than a difference in thermal resistance between the P-type thermoelectric conversion member and the N-type thermoelectric conversion member.

In another aspect of the provided thermoelectric conversion module, a material of the first insulator and a material of the second insulator are different and a difference in thermal resistance between the P-type thermoelectric conversion element and the N-type thermoelectric conversion element is smaller than a difference in thermal resistance between the P-type thermoelectric conversion member and the N-type thermoelectric conversion member.

With this configuration, a thermoelectric conversion module can be provided, which has a small difference in thermal resistance between the P-type thermoelectric conversion element and the N-type thermoelectric conversion element.

Advantageous Effects of Invention

As mentioned above, according to the thermoelectric conversion module of the present invention, the thermal resistance of the P-type thermoelectric conversion element and the thermal resistance of the N-type thermoelectric conversion element can be brought closer to each other so as to exhibit high performance.

DESCRIPTION OF EMBODIMENTS

Hereafter, embodiments of the present invention are described with reference to the accompanying drawings.

FIGS. 1A, 1B, 1C, 1D, 1E, 1F and 1G illustrate the cross-sectional views (a cross section orthogonal to the direction in which current flows through thermoelectric conversion elements during power generation) of thermoelectric conversion module 100 of the present invention.

Thermoelectric conversion module 100 illustrated in FIGS. 1A, 1B, 1C, 1D, 1E, 1F and 1G includes P-type thermoelectric conversion element 110 and N-type thermoelectric conversion element 120. P-type thermoelectric conversion element 110 includes rod-shaped P-type thermoelectric conversion member 111 and cylinder 112 (first insulator) of an insulating material that covers P-type thermoelectric conversion member 111. N-type thermoelectric conversion element 120 includes rod-shaped N-type thermoelectric conversion member 121 and cylinder 122 (second insulator) of an insulating material that covers N-type thermoelectric conversion member 121.

Each of P-type thermoelectric conversion member 111 and N-type thermoelectric conversion member 121 is a rod-shaped member formed of a material that generate the electromotive force with a temperature difference between opposite ends. A Bi—Te (bismuth-tellurium)-based material, which provides a high electromotive voltage in a temperature range from the normal temperature to 500K, is adopted for P-type thermoelectric conversion member 111 and N-type thermoelectric conversion member 121 in Embodiments 1 and 2. Moreover, in Embodiments 3 and 4, a Zn—Sb (zinc-antimony)-based material, which provides a high electromotive voltage in a temperature range from 500 K to 700 K, is adopted for P-type thermoelectric conversion member 111, and Co—Sb (cobalt-antimony)-based material, which provides a high electromotive voltage in a temperature range from 500 K to 900 K, is adopted for N-type thermoelectric conversion member 121. However, any material can be selected for P-type thermoelectric conversion member 111 and N-type thermoelectric conversion member 121 depending on a temperature difference that exists at the time of use when the electromotive force is generated. For example, a Pb—Te (lead-tellurium)-based material may be used when the temperature difference is in the range from the normal temperature to 800 K. Similarly, a skutterudite-based material may be used when the temperature difference is in the range from the normal temperature to 900 K, and a Si—Ge (silicon-germanium)-based material may be used when the temperature difference is in the range from the normal temperature to 1,000 K.

P-type thermoelectric conversion member 111 and N-type thermoelectric conversion member 121 can be obtained by adding a suitable dopant. In a case where the Bi—Te-based material is used for P-type thermoelectric conversion member 111 and N-type thermoelectric conversion member 121, an example of the dopant to obtain P-type thermoelectric conversion member 111 includes Sb. An example of the dopant to obtain N-type thermoelectric conversion member 121 includes Se. The thermoelectric conversion material forms a mixed crystal when these dopants are added. Therefore, these dopants are added in an amount as much as that expressed by a compositional formula such as "$Bi_{0.5}Sb_{1.5}Te_3$" and "$Bi_2Te_{2.7}Se_{0.3}$", for example.

Preferable shapes of P-type thermoelectric conversion member 111 and N-type thermoelectric conversion member 121 include a polygonal column and a circular column from the viewpoint of the productivity of the elements and for aligning the crystal orientation of the thermoelectric conversion material with the axial direction of the cylinder. The circular column is more preferable from the viewpoint of preventing a brittle thermoelectric conversion material from cracking because the circular column can avoid a stress concentration in the corner.

Each of cylinders 112 and 122 is a member formed of a material that is heat-resistant and has insulation properties, and has a cavity that is open at opposite ends. Cylinders 112 and 122 are heat-resistant to keep the shape intact at the temperature experienced at an end on the high temperature side when the element is in use and even at the melting point of the thermoelectric conversion material. Moreover, cylinders 112 and 122 have insulation properties to block the current between P-type thermoelectric conversion member 111 and N-type thermoelectric conversion member 121 when the electromotive force is generated in the thermoelectric conversion module.

Cylinders 112 and 122 each needs to be able to house P-type thermoelectric conversion member 111 and N-type thermoelectric conversion member 121, and to be heat-resistant and have insulation properties. The shapes of cylinders 112 and 122 can be selected from a cylinder, a polygonal cylinder and a polygonal cylinder with round corners, and so on. Material examples of cylinders 112 and 122 include metal oxide such as silica and alumina, heat-resistant glass and quartz, and so on. Materials for cylinders 112 and 122 may preferably be quartz from the viewpoint of resistance to heat, and preferably heat-resistant glass when taking into account the cost.

In the first aspect of the present invention (see Embodiment 1), it is preferable that cylinder 112 of P-type thermoelectric conversion element 110 and cylinder 122 of N-type thermoelectric conversion element 120 have a different cross-sectional area (an area of a cross section orthogonal to the direction in which current flows through thermoelectric conversion elements during power generation) from each other (see FIGS. 1A to 1D).

In the second aspect of the present invention (see Embodiment 2), it is preferable that the thermal resistivity of material of cylinder 112 (the thermal resistivity is the reciprocal of thermal conductivity) is different from the thermal resistivity of the material of cylinder 122.

With these configurations, the difference in thermal resistance between P-type thermoelectric conversion element 110 and N-type thermoelectric conversion element 120 can be smaller than the difference in thermal resistance between P-type thermoelectric conversion member 111 and N-type thermoelectric conversion member 121. Consequently, it is possible to correct (reduce) the difference in thermal resistance between P-type thermoelectric conversion element 110 and N-type thermoelectric conversion element 120. By reducing the difference in thermal resistance between P-type thermoelectric conversion element 110 and N-type thermoelectric conversion element 120, it is possible to prevent the performance degradation of thermoelectric conversion module 100.

Meanwhile, since the areas of cross sections of P-type thermoelectric conversion member 111 and N-type thermoelectric conversion member 121 can be the same, it is possible to correct the difference in thermal resistance without decreasing the electrical resistance of P-type thermoelectric conversion member 111 and N-type thermoelectric conversion member 121. In addition, since the volumes and shapes of P-type thermoelectric conversion member 111 and N-type thermoelectric conversion member 121 can be the same, it is possible to decrease the difference in thermal resistance without decreasing the electrical resistance of P-type thermoelectric conversion member 111 and N-type thermoelectric conversion member 121.

In the third aspect of the present invention (see Embodiment 3), the cross-sectional area (an area of a cross section orthogonal to the direction in which current flows through thermoelectric conversion elements during power generation) is different between P-type thermoelectric conversion member 111 and N-type thermoelectric conversion member 121. Moreover, the cross-sectional area (an area of a cross section orthogonal to the direction in which current flows through thermoelectric conversion elements during power generation) is different between cylinder 112 of P-type thermoelectric conversion element 110 and cylinder 122 of N-type thermoelectric conversion element 120 (see FIG. 1F).

In the fourth aspect of the present invention (see Embodiment 4), it is preferable that the cross-sectional area (an area of a cross section orthogonal to the direction in which current flows through thermoelectric conversion elements during power generation) is different between P-type thermoelectric conversion member 111 and N-type thermoelectric conversion member 121. Moreover, the material of cylinder 112 and the material of cylinder 122 are different. Specifically, it is preferable that the thermal resistivity of the material of cylinder 112 is different from the thermal resistivity of the material of cylinder 122. Moreover, it is preferable that the cross-sectional area (an area of a cross section orthogonal to the direction in which current flows through thermoelectric conversion elements during power generation) is different between cylinder 112 of P-type thermoelectric conversion element 110 and cylinder 122 of N-type thermoelectric conversion element 120 (see FIG. 1G).

With these configurations, the difference in thermal resistance between P-type thermoelectric conversion element 110 and N-type thermoelectric conversion element 120 can be smaller than the difference in thermal resistance between P-type thermoelectric conversion member 111 and N-type thermoelectric conversion member 121. Consequently, it is possible to correct (reduce) the difference in thermal resistance between P-type thermoelectric conversion element 110 and N-type thermoelectric conversion element 120. By reducing the difference in thermal resistance between P-type thermoelectric conversion element 110 and N-type thermoelectric conversion element 120, it is possible to prevent the performance degradation of thermoelectric conversion module 100.

Meanwhile, the difference in electrical resistance can be reduced between P-type thermoelectric conversion member 111 and N-type thermoelectric conversion member 121, when they have a greatly different electric resistivity from each other, by adjusting the cross-sectional areas. Consequently, it is possible to correct (reduce) the difference in electrical resistance between P-type thermoelectric conversion element 110 and N-type thermoelectric conversion element 120. By reducing the difference in electrical resistance between P-type thermoelectric conversion element 110 and N-type thermoelectric conversion element 120, it is possible to prevent the performance degradation of thermoelectric conversion module 100 due to the influence of thermoelectric conversion member 111 or 121 with large electrical resistance.

If the sectional areas of P-type thermoelectric conversion member 111 and N-type thermoelectric conversion member 121 are too small, P-type thermoelectric conversion member 111 and N-type thermoelectric conversion member 121 may be destroyed, and, if they are too large, the number of thermoelectric conversion elements per unit area of thermoelectric conversion module 100 decreases, leading to the performance degradation. Therefore, the sectional areas of P-type thermoelectric conversion member 111 and N-type thermoelectric conversion member 121 are preferably 0.02 $mm^2$ to 4 $mm^2$. Furthermore, the sectional areas of P-type thermoelectric conversion member 111 and N-type thermoelectric conversion member 121 within the range of 0.03 $mm^2$ to 2.6 $mm^2$ are more preferable because the performance improves.

Relatively smaller cross-sectional areas of cylinders 112 and 122 compared with P-type thermoelectric conversion member 111 and N-type thermoelectric conversion member 121 make it possible to increase the sectional area ratio of P-type thermoelectric conversion member 111 and N-type thermoelectric conversion member 121 in thermoelectric conversion module 100. While this improves the performance of thermoelectric conversion module 100, the strength of P-type thermoelectric conversion element 110 and N-type thermoelectric conversion element 120 decreases. Therefore, the cross-sectional areas of cylinders 112 and 122 are preferably 0.2 to 1.7 times the cross-sectional areas of P-type thermoelectric conversion member 111 and N-type thermoelectric conversion member 121. Furthermore, the cross-sectional areas of cylinders 112 and 122 that are 0.4 to 1.5 times the cross-sectional areas of P-type thermoelectric conversion member 111 and N-type thermoelectric conversion member 121 are more preferable because the performance improves.

Figure 1A:
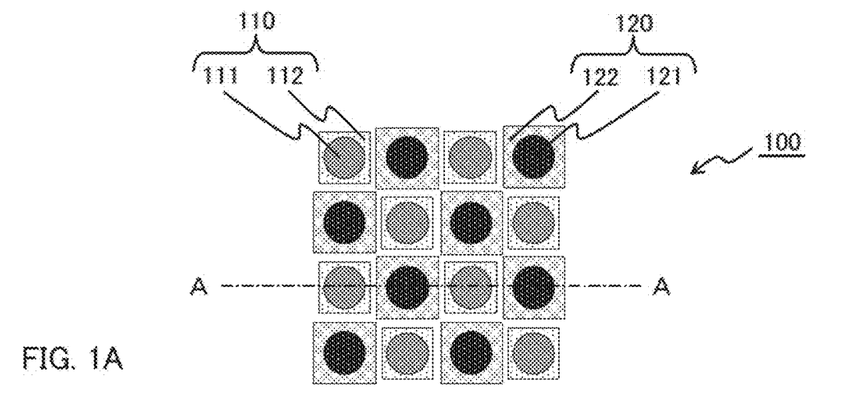
FIG. 1A is a cross-sectional view of a thermoelectric conversion module according to an embodiment of the present invention.

FIG. 1A is a cross-sectional view illustrating one example of a thermoelectric conversion module of the present invention. The cross sections of both P-type thermoelectric conversion element 110 and N-type thermoelectric conversion element 120 are substantially square, but the length of the side is different (the side of N-type thermoelectric conversion element 120 is longer). Since there is no distinction between the long side and the short side in the cross sections, the work is facilitated when assembling P-type thermoelectric conversion element 110 and N-type thermoelectric conversion element 120, and the reliability as a module improves.

Figure 1B:
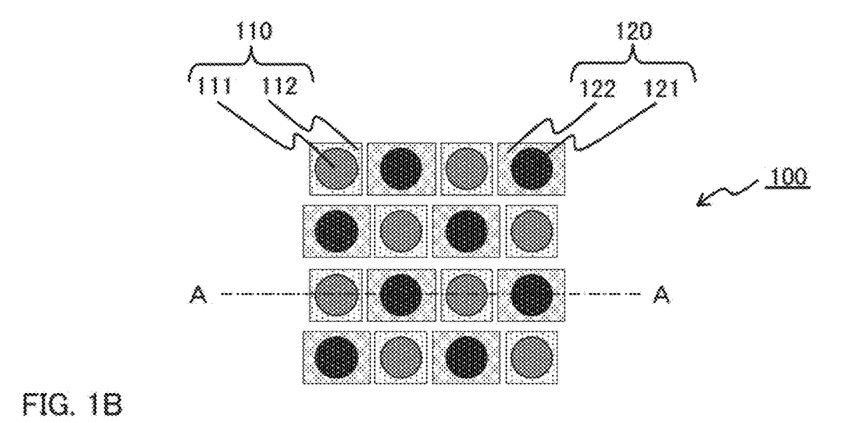
FIG. 1B is a cross-sectional view of a thermoelectric conversion module according to an embodiment of the present invention.

FIG. 1B is a cross-sectional view illustrating one example of the thermoelectric conversion module of the present invention. The cross section is rectangular; one pair of sides of P-type thermoelectric conversion element 110 has substantially the same length as that of N-type thermoelectric conversion element 120, and the other pairs are different (the other pair of sides of N-type thermoelectric conversion element 120 is longer). Since one pair of sides has substantially the same length, the polishing or cutting process can be simplified by, for example, sharing a jig when correcting the cross-sectional areas of cylinders 112 and 122 by polishing or cutting. Moreover, since P-type thermoelectric conversion element 110 and N-type thermoelectric conversion element 120 can be arranged and assembled with a reduced interval (i.e. a smaller space) between them, it is possible to increase the numbers of P-type thermoelectric conversion element 110 and N-type thermoelectric conversion element 120 per unit area.

Figure 1C:
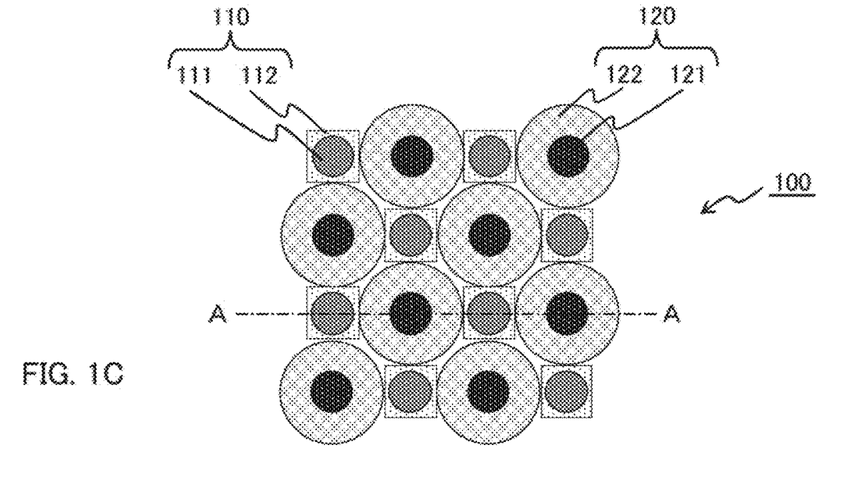
FIG. 1C is a cross-sectional view of a thermoelectric conversion module according to an embodiment of the present invention.

FIG. 1C is a cross-sectional view illustrating one example of the thermoelectric conversion module of the present invention. The cross section of either P-type thermoelectric conversion element 110 or N-type thermoelectric conversion element 120 is circular and the other cross section is quadrangular. A thermoelectric conversion element with a quadrangular cross section can be obtained by polishing or cutting a cylinder. Since one of cylinders 112 and 122 may only need to be polished or cut, the polishing or cutting process can be reduced by half. Moreover, as illustrated in FIG. 1C, when the cross section of one of P-type thermoelectric conversion element 110 and N-type thermoelectric conversion element 120 is circular and that of the other is quadrangular, it is possible to easily distinguish P-type thermoelectric conversion element 110 from N-type thermoelectric conversion element 120 by visual observation. Therefore, when thermoelectric conversion elements are assembled to obtain the thermoelectric conversion module, the risk of misplacement can be reduced. As a result, it is possible to prevent the performance degradation of the thermoelectric conversion module.

Figure 1D:
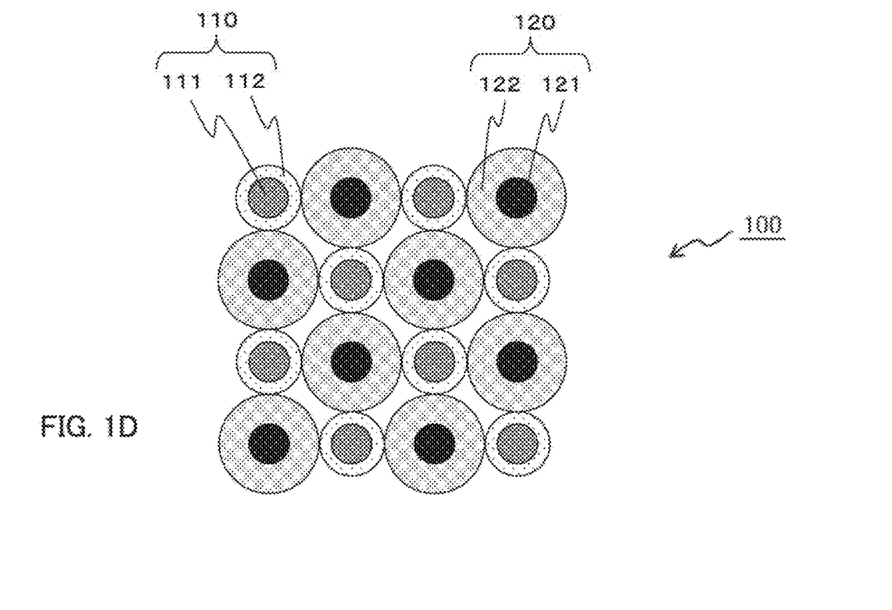
FIG. 1D is a cross-sectional view of a thermoelectric conversion module according to an embodiment of the present invention.

FIG. 1D is a cross-sectional view illustrating one example of the thermoelectric conversion module of the present invention. In FIG. 1D, P-type thermoelectric conversion member 111 and N-type thermoelectric conversion member 121 both have a circular shape in the cross sections and the same cross-sectional area. The inner diameters of cylinders 112 and 122 (the outer diameters of P-type thermoelectric conversion member 111 and N-type thermoelectric conversion member 121) are the same while the outer diameters of cylinders 112 and 122 are different. Therefore, the cross-sectional area of cylinder 112 is different from the cross-sectional area of cylinder 122. P-type thermoelectric conversion element 110 and N-type thermoelectric conversion element 120 are disposed such that cylinders 112 and 122, which have a different external shape, are in line-contact with each other. Further, a space is created in other positions than those where cylinders 112 and 122 are in line-contact with each other.

Figure 1E:
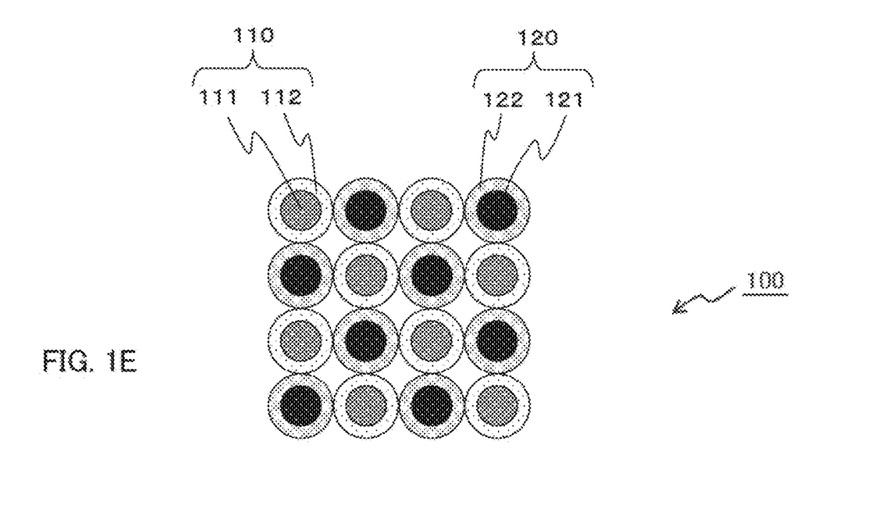
FIG. 1E is a cross-sectional view of a thermoelectric conversion module according to an embodiment of the present invention.

FIG. 1E is a cross-sectional view illustrating one example of the thermoelectric conversion module of the present invention. In FIG. 1E, the cross section of P-type thermoelectric conversion element 110 and the cross section of N-type thermoelectric conversion element 120 have the same shape. That is, the cross section of cylinder 112 of P-type thermoelectric conversion element 110 and the cross section of cylinder 122 of N-type thermoelectric conversion element 120 have the same shape. Further, the material of cylinder 112 of P-type thermoelectric conversion element 110 is different from the material of cylinder 122 of N-type thermoelectric conversion element 120. With the different materials selected, it may be possible to correct the difference in thermal resistance between P-type thermoelectric conversion member 111 and N-type thermoelectric conversion member 121 even if cylinders 112 and 122 have an equal sectional area.

For example, in a case where the cross-sectional areas of P-type thermoelectric conversion element 110 and N-type thermoelectric conversion element 120 are the same and the thermal resistance of P-type thermoelectric conversion member 111 is smaller than N-type thermoelectric conversion member 121, a material that has a thermal resistivity larger than the thermal resistivity of cylinder 122 is selected as a material of cylinder 112.

Figure 1F:
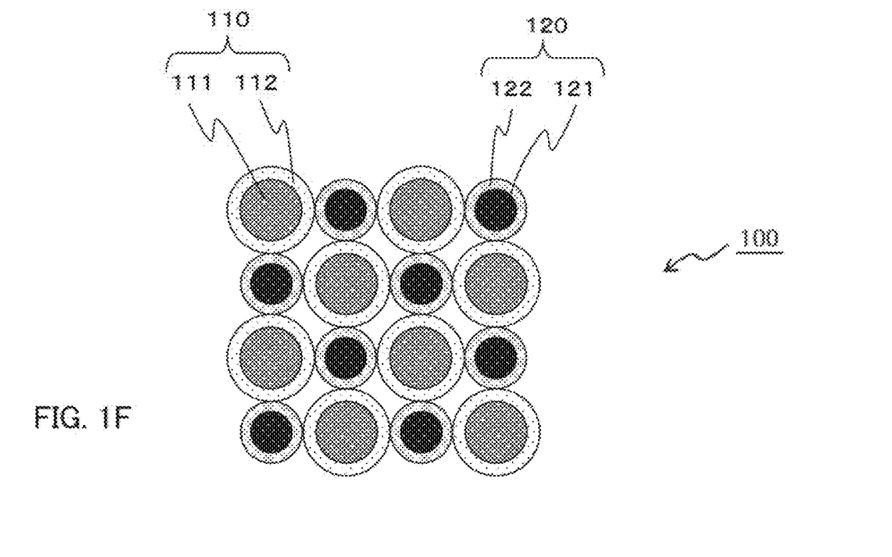
FIG. 1F is a cross-sectional view of a thermoelectric conversion module according to an embodiment of the present invention.

FIG. 1F is a cross-sectional view illustrating one example of the thermoelectric conversion module. In FIG. 1F, the inner diameters of cylinders 112 and 122, (the outer diameters of P-type thermoelectric conversion member 111 and N-type thermoelectric conversion member 121) are different, and the outer diameters of cylinders 112 and 122 are also different. Therefore, the cross-sectional area of P-type thermoelectric conversion member 111 is different from the cross-sectional area of N-type thermoelectric conversion member 121, and the cross-sectional area of cylinder 112 is different from the cross-sectional area of cylinder 122. Moreover, the material of cylinder 112 of P-type thermoelectric conversion element 110 and the material of cylinder 122 of N-type thermoelectric conversion element 120 are the same material.

Figure 1G:
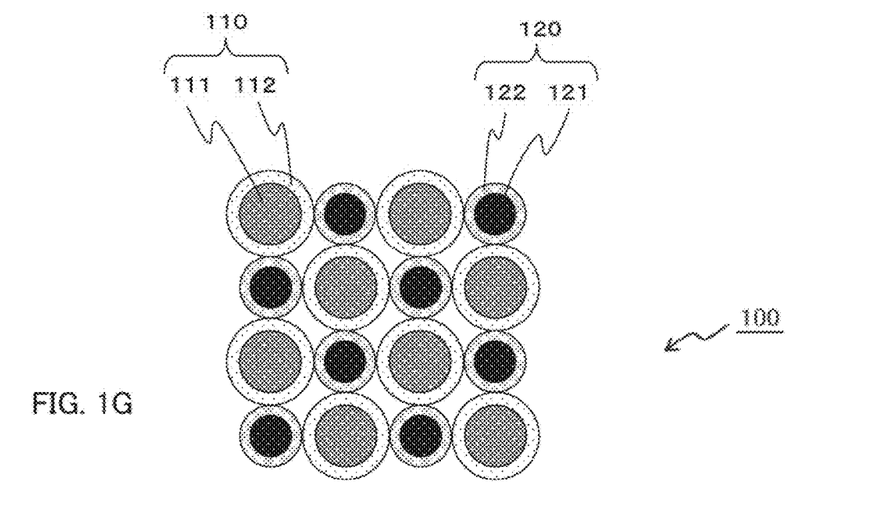
FIG. 1G is a cross-sectional view of a thermoelectric conversion module according to an embodiment of the present invention.

FIG. 1G is a cross-sectional view illustrating one example of the thermoelectric conversion module. In FIG. 1G, the inner diameters of cylinders 112 and 122 (the outer diameters of P-type thermoelectric conversion member 111 and N-type thermoelectric conversion member 121) are different, and the outer diameters of cylinders 112 and 122 are also different. Accordingly, the cross-sectional area of P-type thermoelectric conversion member 111 is different from the cross-sectional area of N-type thermoelectric conversion member 121, and the cross-sectional area of cylinder 112 is different from the cross-sectional area of cylinder 122. Moreover, the material of cylinder 112 of P-type thermoelectric conversion element 110 is different from the material of cylinder 122 of N-type thermoelectric conversion element 120.

When the electromotive force is generated by thermoelectric conversion module 100 (at the time of use), and 1) when the temperature difference between opposite end surfaces of P-type thermoelectric conversion member 111 and the temperature difference between opposite end surfaces of cylinder 112 are substantially equal and 2) the height of P-type thermoelectric conversion member 111 and the height of cylinder 112 are substantially equal, thermal resistance R(p) of P-type thermoelectric conversion element 110 is expressed by following Equation (I). Similarly, thermal resistance R(n) of N-type thermoelectric conversion element 120 is expressed by following Equation (II).

$$1/R(p)=1/R(pm)+1/R(pg)$$

where, $$R(pm)=A(pm)\times L/S(m)$$

$$R(pg)=A(pg)\times L/S(pg)$$

therefore, $$R(p)=\{A(pm)\times A(pg)\times L\}/\{S(m)\times A(pg)+A(pm)\times S(pg)\} \quad \text{Equation (I);}$$

$$R(n)=\{A(nm)\times A(ng)\times L\}/\{S(m)\times A(ng)+A(nm)\times S(ng)\} \quad \text{Equation (II)}$$

In the Equations (I) and (II),
L: Heights of P-type thermoelectric conversion member 111 and cylinder 112
R(pm): Thermal resistance of P-type thermoelectric conversion member 111
R(pg): Thermal resistance of cylinder 112
R(nm): Thermal resistance of N-type thermoelectric conversion member 121
R(ng): Thermal resistance of cylinder 122
A(pm): Thermal resistivity of P-type thermoelectric conversion member 111
A(nm): Thermal resistivity of N-type thermoelectric conversion member 121
A(pg): Thermal resistivity of cylinder 112
A(ng): Thermal resistivity of cylinder 122
S(m): Cross-sectional areas of P-type thermoelectric conversion member 111 and N-type thermoelectric conversion member 121 (when they are not fixed, minimum cross-sectional area of cross section orthogonal to direction in which current flows through P-type thermoelectric conversion member 111 and N-type thermoelectric conversion member 121 during power generation)
S(pg): Cross-sectional area of cylinder 112 (when it is not fixed, minimum cross-sectional area of cross section orthogonal to direction in which current flows through P-type thermoelectric conversion member 111 during power generation), and
S(ng): Cross-sectional area of cylinder 122 (when it is not fixed, minimum cross-sectional area of cross section orthogonal to direction in which current flows through N-type thermoelectric conversion member 121 during power generation).

As shown in FIGS. 1A, 1B, 1C and 1D, in a case where: the cross-sectional areas of P-type thermoelectric conversion member 111 and N-type thermoelectric conversion member 121 are the same while the cross-sectional area of cylinder 112 and the cross-sectional area of cylinder 122 are different; and the materials of cylinders 112 and 122 are the same, $A(pg)=A(ng)=A(g)$ is established.

When $R(p)=R(n)$, $$\{S(ng)-S(pg)\}/\{A(nm)-A(pm)\}=A(g)\times S(m)/\{A(nm)\times A(pm)\}$$

where, $$A(g)\times S(m)/\{A(nm)\times A(pm)\}>0$$

therefore, $$\{S(ng)-S(pg)\}/\{A(nm)-A(pm)\}>0.$$

From the above, $$S(pg)>S(ng) \text{ when } A(pm)>A(nm), \text{ that is, } R(pm)>R(nm)$$

$$S(pg)<S(ng) \text{ when } A(pm)<A(nm), \text{ that is, } R(pm)<R(nm).$$

Therefore, in a case where the thermal resistance of P-type thermoelectric conversion member 111 is larger than the thermal resistance of N-type thermoelectric conversion member 121, it is possible to correct the difference in thermal resistance between P-type thermoelectric conversion member 111 and N-type thermoelectric conversion member 121 by making the cross-sectional area of cylinder 112 larger than the cross-sectional area of cylinder 122. Moreover, in a case where the thermal resistance of P-type thermoelectric conversion member 111 is smaller than the thermal resistance of N-type thermoelectric conversion member 121, it is possible to correct the difference in thermal resistance between P-type thermoelectric conversion member 111 and N-type thermoelectric conversion member 121 by making the cross-sectional area of cylinder 112 smaller than the cross-sectional area of cylinder 122.

Moreover, as shown in FIG. 1E, in a case where the cross-sectional areas of P-type thermoelectric conversion member 111 and N-type thermoelectric conversion member 121 are the same, the cross-sectional area of cylinder 112 and the cross-sectional area of cylinder 122 are the same and the material of cylinder 112 is different from the material of cylinder 122, $S(pg)=S(ng)=S(g)$ is established.

When $R(p)=R(n)$, $$\{A(pm)-A(nm)\}/\{A(ng)-A(pg)\}=A(nm)\times A(pm)\times S(g)/\{A(ng)\times A(pg)\times S(m)\}$$

where, $$A(nm)\times A(pm)\times S(g)/\{A(ng)\times A(pg)\times S(m)\}>0$$

therefore, $$\{A(pm)-A(nm)\}/\{A(ng)-A(pg)\}>0.$$

From the above, $$A(ng)>A(pg) \text{ when } A(pm)>A(nm), \text{ that is, } R(pm)>R(nm)$$

$$A(ng)<A(pg) \text{ when } A(pm)<A(nm), \text{ that is, } R(pm)<R(nm).$$

Therefore, in a case where the thermal resistance of P-type thermoelectric conversion member 111 is larger than the thermal resistance of N-type thermoelectric conversion member 121, it is possible to correct the difference in thermal resistance between P-type thermoelectric conversion member 111 and N-type thermoelectric conversion member 121 by selecting a material with a smaller thermal resistivity than cylinder 122 as a material of cylinder 112. Moreover, in a case where the thermal resistance of P-type thermoelectric conversion member 111 is smaller than the thermal resistance of N-type thermoelectric conversion member 121, it is possible to correct the difference in thermal resistance between P-type thermoelectric conversion member 111 and N-type thermoelectric conversion member 121 by selecting a material with a larger thermal resistivity than cylinder 122 as a material of cylinder 112.

Moreover, thermal resistances R(p) and R(n) of P-type thermoelectric conversion element 110 and N-type thermoelectric conversion element 120 can be actually measured by "temperature gradient method". The measurement of thermal resistance R by the temperature gradient method can be performed in the following way. P-type thermoelectric conversion element 110 or N-type thermoelectric conversion element 120 is sandwiched between a heated jig and a cooled jig. The thermal resistance of P-type thermoelectric conversion element 110 or N-type thermoelectric conversion element 120 is calculated from the temperature difference between upper and lower end surfaces of P-type thermoelectric conversion element 110 or N-type thermoelectric conversion element 120 and the height of P-type thermoelectric conversion element 110 or N-type thermoelectric conversion element 120. P-type thermoelectric conversion element 110 or N-type thermoelectric conversion element 120 is sandwiched between the heated jig and the cooled jig such that the upper and lower end surfaces of the thermoelectric conversion member and the cylinder are in contact with the end surfaces of the jigs. Accordingly, it is possible to measure the thermal resistance of P-type thermoelectric conversion element 110 or N-type thermoelectric conversion element 120 formed of the thermoelectric conversion member and the cylinder.

It is preferable that the difference between thermal resistance R(p) of P-type thermoelectric conversion element 110 and thermal resistance R(n) of N-type thermoelectric conversion element 120 is smaller than 1° C./W, and it is more preferable that it is smaller than 0.5° C./W from the viewpoint of reliability. This is because, the smaller the difference between thermal resistance R(p) and thermal resistance R(n) is, the closer the quantity of heat passing P-type thermoelectric conversion element 110 and the quantity of heat passing N-type thermoelectric conversion element 120 are brought, and the degradation in the module performance can be prevented.

[Embodiment 1]

In a case where P-type thermoelectric conversion member 111 and N-type thermoelectric conversion member 121 are of a Bi—Te-based material and heat-resistant glass is used for cylinders 112 and 122, it is preferable that the cross-sectional area of cylinder 112 of P-type thermoelectric conversion element 110 is smaller than that of cylinder 122 of N-type thermoelectric conversion element 120.

Moreover, even in a case where P-type thermoelectric conversion member 111 and N-type thermoelectric conversion member 121 are of a Bi—Te-based material and quartz is used for cylinders 112 and 122, it is preferable that the cross-sectional area of cylinder 112 of P-type thermoelectric conversion element 110 is smaller than that of cylinder 122 of N-type thermoelectric conversion element 120.

In Embodiment 1, P-type thermoelectric conversion element 110 and N-type thermoelectric conversion element 120 illustrated in FIG. 1D are prepared. P-type thermoelectric conversion member 111 and N-type thermoelectric conversion member 121 are of the Bi—Te-based material. To be more specific, in a case where the thermal resistivity of the P-type thermoelectric conversion member is set to be 0.74 m·K·W$^{-1}$, the thermal resistivity of the N-type thermoelectric conversion member is set to be 0.79 m·K·W$^{-1}$ and the cross-sectional areas of P-type thermoelectric conversion member 111 and N-type thermoelectric conversion member 121 are each 0.50 mm$^2$ (a circular column with a diameter of 0.80 mm), the thermal resistance of P-type thermoelectric conversion member 111 is 737° C./W and the thermal resistance of the N-type thermoelectric conversion member is 783° C./W. Cylinders 112 and 122 are of Pyrex (registered trademark) with a thermal resistivity of 1.00 m·K·W$^{-1}$ made by Corning Incorporated, the cross-sectional area of cylinder 112 of P-type thermoelectric conversion element 110 is 0.28 mm$^2$ (a cylinder with an outer diameter of 1.00 mm), and the cross-sectional area of cylinder 122 of N-type thermoelectric conversion element 120 is 0.32 mm$^2$ (a cylinder with an outer diameter of 1.03 mm). With this configuration, the difference between thermal resistance R(p) of P-type thermoelectric conversion element 110 and thermal resistance R(n) of N-type thermoelectric conversion element 120 is 0.07° C./W.

[Embodiment 2]

In Embodiment 2, P-type thermoelectric conversion element 110 and N-type thermoelectric conversion element 120 illustrated in FIG. 1E are prepared. Specifically, the cross section of P-type thermoelectric conversion element 110 and the cross section of N-type thermoelectric conversion element 120 have the same shape. The Bi—Te-based material is used for P-type thermoelectric conversion member 111 and N-type thermoelectric conversion member 121.

In a case where the thermal resistivity of P-type thermoelectric conversion member 111 is set to be 0.74 m·K·W$^{-1}$, the thermal resistivity of N-type thermoelectric conversion member 121 is set to be 0.79 m·K·W$^{-1}$ and the cross-sectional areas of P-type thermoelectric conversion member 111 and N-type thermoelectric conversion member 121 are each 0.50 mm$^2$ (a circular column with a diameter of 0.80 mm), the thermal resistance of P-type thermoelectric conversion member 111 is 737° C./W and the thermal resistance of N-type thermoelectric conversion member 121 is 783° C./W. In a case where the cross-sectional areas of cylinders 112 and 122 are 0.80 mm$^2$ (a cylinder with an outer diameter of 1.29 mm), it is suitable to use soda-lime glass with a thermal resistivity of 1.05 m·K·W$^{-1}$ and thermal resistance of 658° C./W for cylinder 112 and Pyrex (registered trademark) with a thermal resistivity of 1.00 m·K·W$^{-1}$ and thermal resistance of 625° C./W made by Corning Incorporated for cylinder 122. With this configuration, the difference between thermal resistance R(p) of P-type thermoelectric conversion element 110 and thermal resistance R(n) of N-type thermoelectric conversion element 120 is 0.05° C./W.

[Embodiment 3]

In Embodiment 3, P-type thermoelectric conversion element 110 and N-type thermoelectric conversion element 120 illustrated in FIG. IF are prepared. Specifically, the cross section of P-type thermoelectric conversion element 110 and the cross section of N-type thermoelectric conversion element 120 have a different shape. A Zn—Sb-based material is used for P-type thermoelectric conversion member 111 and a Co—Sb-based material is used for N-type thermoelectric conversion member 121. The materials of cylinders 112 and 122 are quartz glass.

The electric resistivity of P-type thermoelectric conversion member 111 is set to be 2.75×10$^{-5}$) Ωm, the electric resistivity of N-type thermoelectric conversion member 121 is set to be 1.40×10$^{-5}$) Ωm, the cross-sectional area of P-type thermoelectric conversion member 111 is 0.99 mm$^2$ (a circular column with a diameter of 1.12 mm) and the cross-sectional area of N-type thermoelectric conversion member 121 is 0.50 mm$^2$ (a circular column with a diameter of 0.80 mm). With this configuration, the difference between the electrical resistance of P-type thermoelectric conversion member 111 and the electrical resistance of N-type thermoelectric conversion member 121 is 6.87×10$^{-5}$ Ω.

The thermal resistivity of P-type thermoelectric conversion member 111 is set to be 1.47 m·K·W$^{-1}$ and the thermal resistivity of N-type thermoelectric conversion member 121 is set to be 0.34 m·K·W$^{-1}$. In this configuration, the thermal resistance of P-type thermoelectric conversion member 111 is 741° C./W and the thermal resistance of N-type thermoelectric conversion member 121 is 343° C./W. The materials of cylinders 112 and 122 are quartz glass with a thermal resistivity of 0.72 m·K·W$^{-1}$, the cross-sectional area of cylinder 112 is 0.85 mm$^2$ (a cylinder with a diameter of 1.53 mm), and the cross-sectional area of cylinder 122 is 0.28 mm$^2$ (a cylinder with a diameter of 1.00 mm). With this configuration, the difference between thermal resistance R(p) of P-type thermoelectric conversion element 110 and thermal resistance R(n) of N-type thermoelectric conversion element 120 is 0.20° C./W.

[Embodiment 4]

In Embodiment 4, P-type thermoelectric conversion element 110 and N-type thermoelectric conversion element 120 illustrated in FIG. 1G are prepared. Specifically, the cross section of P-type thermoelectric conversion element 110 and the cross section of N-type thermoelectric conversion element 120 have a different shape. The Zn—Sb-based material is used for P-type thermoelectric conversion member 111 and the Co—Sb-based material is used for N-type thermoelectric conversion member 121. Heat-resistant glass is adopted for cylinder 112 and quartz glass is adopted for cylinder 122. Since the melting point of the Co—Sb-based material is high, cylinder 122 is formed of quartz to implement the process of manufacture described below.

The electric resistivity of P-type thermoelectric conversion member 111 is set to be 2.75×10$^{-5}$ Ωm, the electric resistivity of N-type thermoelectric conversion member 121 is set to be 1.40×10$^{-5}$) Ωm, the cross-sectional area of P-type thermoelectric conversion member 111 is 0.99 mm$^2$ (a circular column with a diameter of 1.12 mm), and the cross-sectional area of N-type thermoelectric conversion member 121 is 0.50 mm$^2$ (a circular column with a diameter of 0.80 mm). With this configuration, the difference between the electrical resistance of P-type thermoelectric conversion member 111 and the electrical resistance of N-type thermoelectric conversion member 121 is 6.87×10$^{-5}$ Ω, and the difference is made smaller than the case of the same cross section.

The thermal resistivity of P-type thermoelectric conversion member 111 is set to be 1.47 m·K·W$^{-1}$ and the thermal resistivity of N-type thermoelectric conversion member 121 is set to be 0.34 m·K·W$^{-1}$. In this configuration, the thermal resistance of P-type thermoelectric conversion member 111 is 741° C./W and the thermal resistance of N-type thermoelectric conversion member 121 is 343° C./W. It is suitable to set the cross-sectional area of cylinder 112 to be 1.17 mm$^2$ (a cylinder with a diameter of 1.66 mm), set the cross-sectional area of cylinder 122 to be 0.28 mm$^2$ (a cylinder with a diameter of 1.00 mm), use Pyrex (registered trademark) with a thermal resistivity of 1.00 m·K·W$^{-1}$ made by Corning Incorporated for cylinder 112, and use quartz glass with thermal resistivity of 0.72 m·K·W$^{-1}$ for cylinder 122. With this configuration, the difference between thermal resistance R(p) of P-type thermoelectric conversion element 110 and thermal resistance R(n) of N-type thermoelectric conversion element 120 is 0.17° C./W.

Figure 2:
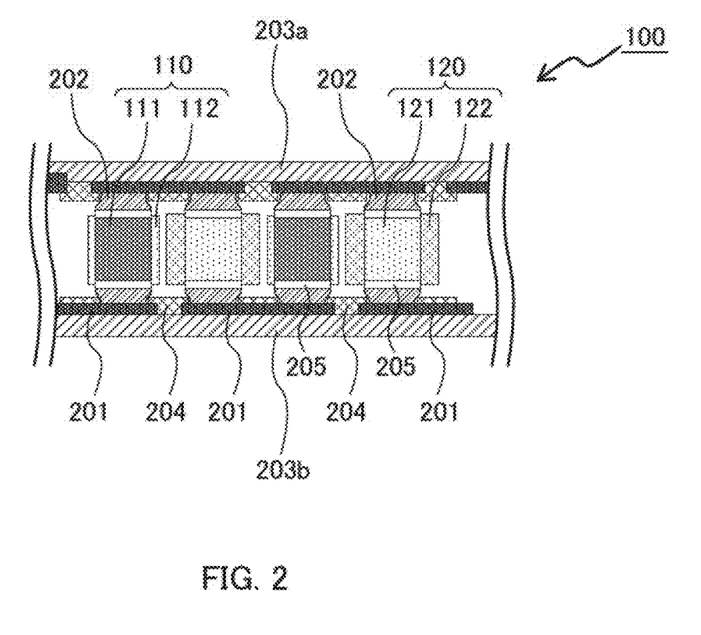
FIG. 2 is a longitudinal cross-sectional view of a thermoelectric conversion module according to an embodiment of the present invention.

FIG. 2 is a longitudinal cross-sectional view (a cross section parallel to the direction in which current flows through thermoelectric conversion elements during power generation) of the thermoelectric conversion module of the present invention, which is a cross-sectional view taken along A-A in FIG. 1A.

Electrode 201 is electrically connected with the end surfaces of P-type thermoelectric conversion member 111 and N-type thermoelectric conversion member 121. Accordingly, as illustrated in FIG. 2, thermoelectric conversion module 100 can be constructed such that P-type thermoelectric conversion element 110 is electrically connected in series with N-type thermoelectric conversion element 120 in an alternate manner.

Electrode 201, P-type thermoelectric conversion member 111 and N-type thermoelectric conversion member 121 may be bonded by means of bonding material 202 such as solder and a brazing material, or may be directly bonded without the bonding material. Material examples of electrode 201 include single metals or alloys including any one of Bi, Cu, Sb, In, Ni, Al, Ag, Au, Pt and Pd. As bonding material 202, for example, it is possible to use single metals or alloys including any one of Sn, Pb, Ag, Bi, In, Sb and Au.

As electrode 201, electrode 201 previously formed on upper substrate 203a and lower substrate 203b may be used or electrode 201 may be formed on P-type thermoelectric conversion element 110 and N-type thermoelectric conversion element 120 by deposition, sputtering, thermal spraying or the like. Although upper substrate 203a and lower substrate 203b are used in the present embodiment, these substrates may not be used.

Resist 204 may be present on upper substrate 203a and lower substrate 203b. The resist may not necessarily be present, but the presence of the resist may be preferable in order to prevent misalignment when P-type thermoelectric conversion element 110 and N-type thermoelectric conversion element 120 are assembled.

The length of P-type thermoelectric conversion element 110 and N-type thermoelectric conversion element 120 in the longitudinal direction (the direction in which current flows during power generation) is preferably 0.15 to 2.0 mm from the viewpoint of causing a suitable temperature difference between opposite ends of the thermoelectric conversion member.

Here, P-type thermoelectric conversion member 111 and N-type thermoelectric conversion member 121 may have base metal 205 on the end surface. Since base metal 205 is a metal layer provided for enhancing the bondability of P-type thermoelectric conversion member 111 and N-type thermoelectric conversion member 121 to electrode 201 or for suppressing the power generation capacity degradation of P-type thermoelectric conversion member 111 and N-type thermoelectric conversion member 121 due to the diffusion from bonding material 202 and electrode 201. It is preferable that the thickness of base metal 205 is 3.0 to 6.0 μm from the viewpoint of obtaining desired bondability and the improvement in module reliability. Examples of base metal 205 include single metal or alloy including ay one of Ni, Mo, Ti and W, and it is preferable to use Ni or Mo. In the present embodiment, Ni is used for base metal 205.

Figure 3:
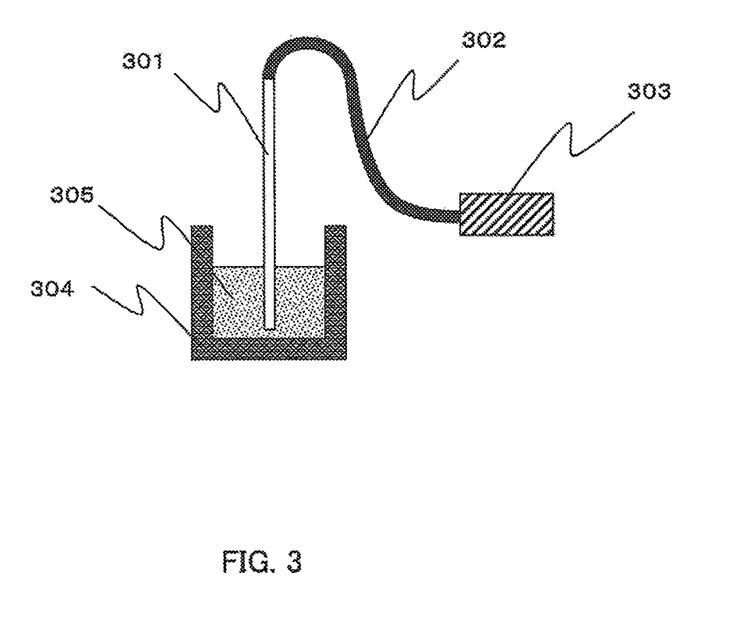
FIG. 3 is a manufacturing process diagram of a thermoelectric conversion module according to an embodiment of the present invention.

The manufacturing method of the above-mentioned thermoelectric conversion element module will be described. First, the manufacturing method of thermoelectric conversion elements will be described with reference to FIG. 3. As illustrated in FIG. 3, pipe 301 that is heat-resistant and has insulation properties is prepared. As pipe 301, it is preferable to use a pipe of glass, in particular, heat-resistant glass (a kind of borosilicate glass that is a mixture of SiO$_2$ and B$_2$O$_3$ with a coefficient of thermal expansion of about 3×10$^{-6}$/K). Examples of generally-known heat-resistant glass include Pyrex (registered trademark) glass made by Corning Incorporated. In the present embodiment, pipe 301 made of Pyrex (registered trademark) glass with total length L of 150 mm, inner diameter d1 of 0.8 mm and outer diameter d2 of 2 mm is used.

Next, cylinder 303 is attached to one end of pipe 301 in FIG. 3 with tube 302 interposed and the other end is soaked in molten thermoelectric conversion material 305 in crucible 304. The pressure within pipe 301 is then reduced by cylinder 303 to suck molten thermoelectric conversion material 305 in pipe 301. Molten thermoelectric conversion material 305 sucked in pipe 301 is solidified to form P-type thermoelectric conversion member 111 or N-type thermoelectric conversion member 121.

For filling pipe 301 with P-type thermoelectric conversion member 111 or N-type thermoelectric conversion member 121, a method that may be used is to put powdered thermoelectric conversion member in the pipe and heat pipe 301 at the temperature equal to or greater than the melting point of a thermoelectric conversion member to melt the thermoelectric conversion member.

Next, the cross section of pipe 301 is made to have a desired sectional area by polishing and/or cutting pipe 301, and so on. For example, it is possible to use polishing in which pipe 301 is pressed against a rotation grinding machine and/or cutting by center less grinding. In the present embodiment, pipe 301 has a cylindrical shape, and the shapes of P-type thermoelectric conversion member 111 and N-type thermoelectric conversion member 121 in pipe 301 are a circular column.

Next, by cutting pipe 301 in a desired length, P-type thermoelectric conversion element 110 or N-type thermoelectric conversion element 120 is formed.

In addition, P-type thermoelectric conversion element 110 and N-type thermoelectric conversion element 120 are assembled on upper substrate 203a and lower substrate 203b to form thermoelectric conversion module 100.

Here, although cylinder 112 is illustrated as one example of the first insulator, any member that covers at least part of P-type thermoelectric conversion member 111 may be used for the first insulator, and, for example, the first insulator may be configured so as to expose part of the side surface of P-type thermoelectric conversion member 111. To be more specific, the first insulator may be composed of a couple of members that sandwich the side surface of P-type thermoelectric conversion member 111. Similarly, any member that coverts at least part of N-type thermoelectric conversion member 121 may be used for the second insulator, and, for example, the second insulator may be configured so as to expose part of the side surface of N-type thermoelectric conversion member 121. To be more specific, the second insulator may be composed of a couple of members that sandwich the side surface of N-type thermoelectric conversion member 121.

INDUSTRIAL APPLICABILITY

According to the present invention, by making the thermal resistances of the P-type thermoelectric conversion element and the N-type thermoelectric conversion element close to each other (reducing the difference in thermal resistance), a thermoelectric conversion module that exhibits high performance is obtained. Accordingly, the present invention is widely applicable to a case where it is necessary to directly convert heat into electricity and a case where it is necessary to convert electricity into heat, in various technical fields.

REFERENCE SIGNS LIST

100 Thermoelectric conversion module
110 P-type thermoelectric conversion element
111 P-type thermoelectric conversion member
112 cylinder
120 N-type thermoelectric conversion element
121 N-type thermoelectric conversion member
122 cylinder
201 electrode
202 bonding material
203a upper substrate
203b lower substrate
204 resist
205 base metal
301 pipe
302 tube
303 cylinder
304 crucible
305 molten thermoelectric conversion material

What is claimed is:

1. A module comprising:
   a P-type thermoelectric conversion element having a P-type thermoelectric conversion member and a first insulator to cover the P-type thermoelectric conversion member; and
   a N-type thermoelectric conversion element having an N-type thermoelectric conversion member and a second insulator to cover the N-type thermoelectric conversion member,
   wherein a cross-sectional area of the first insulator and a cross-sectional area of the second insulator are selected to be different,
   the cross-sectional area of the first insulator and the cross-sectional area of the second insulator, a cross-sectional area of the P-type thermoelectric conversion member and a cross-sectional area of the N-type thermoelectric conversion member are disposed in a same cross section orthogonal to a direction of current flowing in the P-type thermoelectric conversion member or the N-type thermoelectric conversion member, and
   a difference in thermal resistance between the P-type thermoelectric conversion element and the N-type thermoelectric conversion element is smaller than a difference in thermal resistance between the P-type thermoelectric conversion member and the N-type thermoelectric conversion member,
   wherein the cross-sectional area of the first insulator is formed larger than the cross-sectional area of the second insulator in a case where the thermal resistance of the P-type thermoelectric conversion member is larger than the thermal resistance of the N-type thermoelectric conversion member, or
   the cross-sectional area of the first insulator is formed smaller than the cross-sectional area of the second insulator in a case where the thermal resistance of the P-type thermoelectric conversion member is smaller than the thermal resistance of the N-type thermoelectric conversion member.

2. The module according to claim 1, wherein the cross-sectional area of the P-type thermoelectric conversion member and the cross-sectional area of the N-type thermoelectric conversion member are the same.

3. The module according to claim 1, wherein the P-type thermoelectric conversion member is formed of a Zn—Sb-based material and the N-type thermoelectric conversion member is formed of a Co—Sb-based material.

4. The module according to claim 1, wherein the cross-sectional area of the first insulator and the cross-sectional area of the second insulator are 0.2 to 1.7 times the cross-sectional area of the P-type thermoelectric conversion member and the cross-sectional area of the N-type thermoelectric conversion member.

5. The module according to claim 1, wherein the cross-sectional area of the first insulator and the cross-sectional area of the second insulator are 0.4 to 1.5 times the cross-sectional area of the P-type thermoelectric conversion member and the cross-sectional area of the N-type thermoelectric conversion member.

6. The module according to claim 1, wherein the first insulator and the second insulator are formed of different materials.

7. The module according to claim 1, wherein the difference between the thermal resistance of the P-type thermoelectric conversion element and the thermal resistance of the N-type thermoelectric conversion element is smaller than 1° C./W.

8. The module according to claim 1, wherein the difference between the thermal resistance of the P-type thermoelectric conversion element and the thermal resistance of the N-type thermoelectric conversion element is smaller than 0.5° C./W.

9. A module comprising:
a P-type thermoelectric conversion element having a P-type thermoelectric conversion member and a first insulator to cover the P-type thermoelectric conversion member; and
a N-type thermoelectric conversion element having an N-type thermoelectric conversion member and a second insulator to cover the N-type thermoelectric conversion member,
wherein a cross-sectional area of the first insulators and a cross-sectional area of the second insulators are selected to be different,
a material of the first insulator and a material of the second insulator are different, and
a difference in thermal resistance between the P-type thermoelectric conversion element and the N-type thermoelectric conversion element is smaller than a difference in thermal resistance between the P-type thermoelectric conversion member and the N-type thermoelectric conversion member, and
the cross-sectional area of the first insulator, the cross-sectional area of the second insulator, a cross-sectional area of the P-type thermoelectric conversion member and a cross-sectional area of the N-type thermoelectric conversion member are disposed in a same cross section orthogonal to a direction of current flowing in the P-type thermoelectric conversion member or the N-type thermoelectric conversion member,
wherein the first insulator is selected from a material with a smaller thermal resistivity than the second insulator as a material in a case where the thermal resistance of the P-type thermoelectric conversion member is larger than the thermal resistance of the N-type thermoelectric conversion member, or
the first insulator is selected from a material with a larger thermal resistivity than the second insulator as a material in a case where the thermal resistance of the P-type thermoelectric conversion member is smaller than the thermal resistance of the N-type thermoelectric conversion member.

10. The module according to claim 9, wherein the cross-sectional area of the first insulator and the cross-sectional area of the second insulator are 0.2 to 1.7 times the cross-sectional area of the P-type thermoelectric conversion member and the cross-sectional area of the N-type thermoelectric conversion member.

11. The module according to claim 9, wherein the cross-sectional area of the first insulator and the cross-sectional area of the second insulator are 0.4 to 1.5 times the cross-sectional area of the P-type thermoelectric conversion member and the cross-sectional area of the N-type thermoelectric conversion member.

12. The module according to claim 9, wherein:
the P-type thermoelectric conversion member is formed of a Zn—Sb-based material;
the N-type thermoelectric conversion member is formed of a Co—Sb-based material; and
the first insulator is formed of heat-resistant glass and the second insulator is formed of quartz.

13. The module according to claim 9, wherein the difference between the thermal resistance of the P-type thermoelectric conversion element and the thermal resistance of the N-type thermoelectric conversion element is smaller than 1° C./W.

14. The module according to claim 9, wherein the difference between the thermal resistance of the P-type thermoelectric conversion element and the thermal resistance of the N-type thermoelectric conversion element is smaller than 0.5° C./W.

* * * * *